(12) United States Patent
Chien et al.

(10) Patent No.: US 10,032,962 B2
(45) Date of Patent: Jul. 24, 2018

(54) LED PACKAGE STRUCTURE

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: I-Chen Chien, Keelung (TW); Shih-Chang Hsu, Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

(*) Notice: Subject to any disclaimer, the term of this patent is extended or adjusted under 35 U.S.C. 154(b) by 0 days.

(21) Appl. No.: 15/162,044

(22) Filed: May 23, 2016

(65) Prior Publication Data
US 2017/0200867 A1 Jul. 13, 2017

(30) Foreign Application Priority Data
Jan. 13, 2016 (CN) .......................... 2016 1 0025258

(51) Int. Cl.
| | |
|---|---|
| *H01L 33/44* | (2010.01) |
| *H01L 33/48* | (2010.01) |
| *H01L 21/56* | (2006.01) |
| *H01L 21/50* | (2006.01) |
| *H01L 33/60* | (2010.01) |
| *H01L 33/62* | (2010.01) |

(52) U.S. Cl.
CPC ............ *H01L 33/486* (2013.01); *H01L 33/60* (2013.01); *H01L 33/62* (2013.01);
(Continued)

(58) Field of Classification Search
CPC ...... H01L 33/486; H01L 27/15; H01L 33/505
(Continued)

(56) References Cited

U.S. PATENT DOCUMENTS

| | | | |
|---|---|---|---|
| 2005/0173708 A1* | 8/2005 | Suehiro | H01L 33/56 257/79 |
| 2009/0173957 A1* | 7/2009 | Brunner | C09K 11/7701 257/98 |

(Continued)

FOREIGN PATENT DOCUMENTS

TW I358139 2/2012

*Primary Examiner* — Moazzam Hossain
*Assistant Examiner* — Omar Mojaddedi
(74) *Attorney, Agent, or Firm* — Li & Cai Intellectual Property (USA) Office

(57) ABSTRACT

An LED package structure includes a conductive frame assembly, a reflective housing, an UV LED chip disposed on the conductive frame assembly, and a die-attach adhesive for bonding the UV LED chip to the conductive frame assembly. The reflective housing includes Silicone Molding Compound (SMC) and filler mixed in the SMC. The energy gap of the filler is greater than or equal to 4 eV. The energy gap of the filler thereof can be chosen by the following formulas. When the refractive index difference between the filler and the SMC is less than or equal to 0.2, the energy gap of the filler is satisfied the following formula. $E \geq 1240$ (nm·eV)/($\lambda - 150$(nm)). When the refractive index difference between the filler and the SMC is greater than 0.2, the energy gap of the filler is satisfied the following formula. $E \geq 1240$(nm·eV)/($\lambda - 50$(nm)).

11 Claims, 8 Drawing Sheets

(52) U.S. Cl.
CPC ............... *H01L 2224/48247* (2013.01); *H01L 2933/0033* (2013.01); *H01L 2933/0058* (2013.01)

(58) Field of Classification Search
USPC .......................................................... 257/98
See application file for complete search history.

(56) References Cited

U.S. PATENT DOCUMENTS

| | | | | |
|---|---|---|---|---|
| 2010/0276713 | A1* | 11/2010 | Wu | H01L 33/505 257/98 |
| 2011/0297991 | A1* | 12/2011 | Furuyama | H01L 33/46 257/98 |
| 2012/0112337 | A1* | 5/2012 | Groetsch | H01L 33/486 257/712 |
| 2012/0125671 | A1* | 5/2012 | Sato | C09J 7/0203 174/258 |
| 2012/0170277 | A1* | 7/2012 | Tamura | C08G 69/265 362/296.02 |
| 2014/0063819 | A1* | 3/2014 | Nam | H01L 33/60 362/341 |
| 2016/0079479 | A1* | 3/2016 | Yamana | H01L 51/5268 257/98 |
| 2016/0211208 | A1* | 7/2016 | McConnelee | H01L 23/49838 257/697 |

* cited by examiner

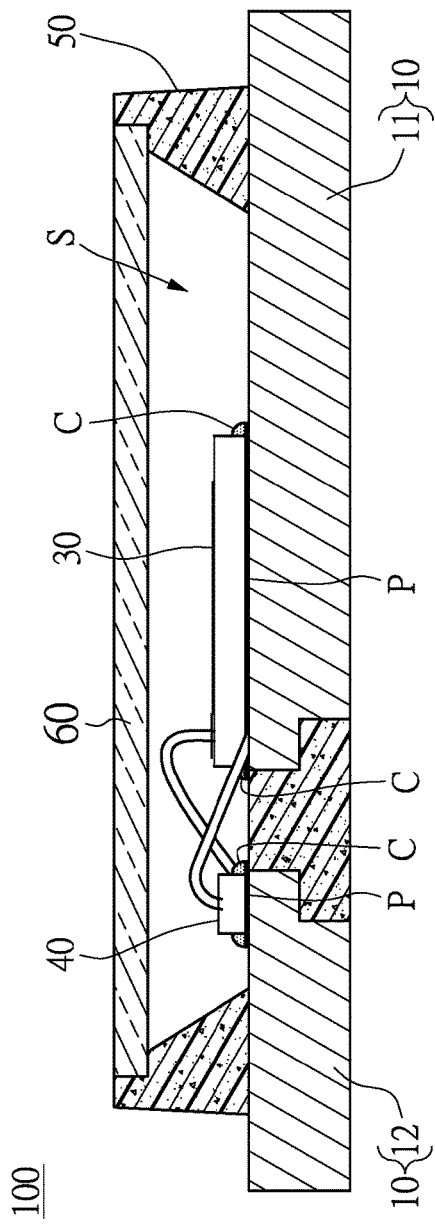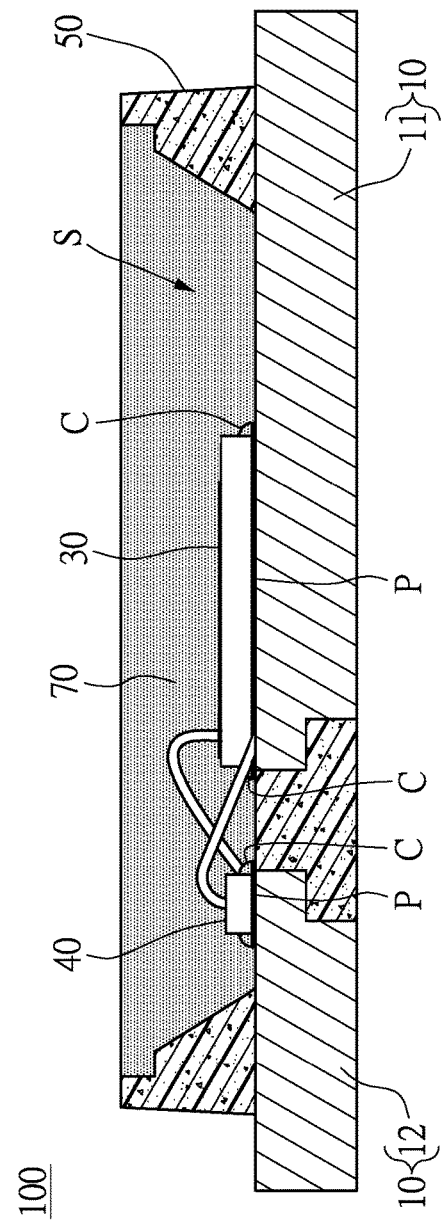

LED PACKAGE STRUCTURE

TECHNICAL FIELD

The present disclosure relates to an LED package structure, and more particularly to an LED package structure having a conductive frame assembly in combination with a reflective housing using the silicone molding compound.

BACKGROUND ART

LED (Light Emitting Diode) has been gradually used as a light source for various purposes. For example, LED emitting visible light is used for general illumination. LED emitting invisible light is used for special illumination, such as UV light is used for curing, sterilization, security identification, and the like.

UV Light emitted from UV LEDs is short-waveband with strong energy, and thus the material requirements of a conductive frame assembly and a reflective housing for a UV LED package structure are more strict, affecting not only the package's lifetime but also its overall light reflectivity.

In order to avoid materials of UV LED package from being degraded due to a long-time UV irradiation, a ceramic substrate and the reflective housing made of glass or ceramics is usually used in the UV LED package structure. However, the material cost is high and manufacturing method is time-consuming.

Thus, apart from the UV-resistant materials needed in the UV LED package, it is also necessary to reduce the manufacturing cost of the UV LED package in order to meet the market demands.

SUMMARY OF THE PRESENT INVENTION

The objective of the present disclosure is to provide a UV LED package structure to solve the technical issues. A high light reflectivity in UV wavebands of the UV LED package structure can be provided by using a silicone molding compound and a filler mixed therewith as a reflective housing, such that the UV LED package structure has a better performance and a lower cost.

The advantageous effect of the present disclosure is that an inorganic material with a wide energy gap mixed with a silicone molding compound (a resin material) is chosen to be a reflective housing of the LED package structure. Such a choice, compared with using ceramics as a material for the reflective housing, a lower manufacture cost and easy production can be achieved in the present disclosure. In combination with the formulas of the present disclosure, a suitable energy gap of filler may be selected in accordance with a desired wavelength of the UV light of the UV LED chip.

In order to further understand the techniques, methods, and effects adopted by the present disclosure for the given objectives, reference can be made to the detailed description and drawings of the present disclosure, whereby the objectives, features, and characteristics of the present disclosure can be understood deeply and concretely. However, the accompanying drawings and appendixes are only provided for reference and illustration, not for limiting the present disclosure.

BRIEF DESCRIPTION OF DRAWINGS

FIG. 4 is a cross-sectional view along an IV-IV line in FIG. 1 according to the present disclosure.

FIG. 4A is a cross-sectional view according to another embodiment of the LED package structure of the present disclosure.

DETAILED DESCRIPTION OF THE PREFERRED EMBODIMENTS

[First Embodiment]

Figure 1:
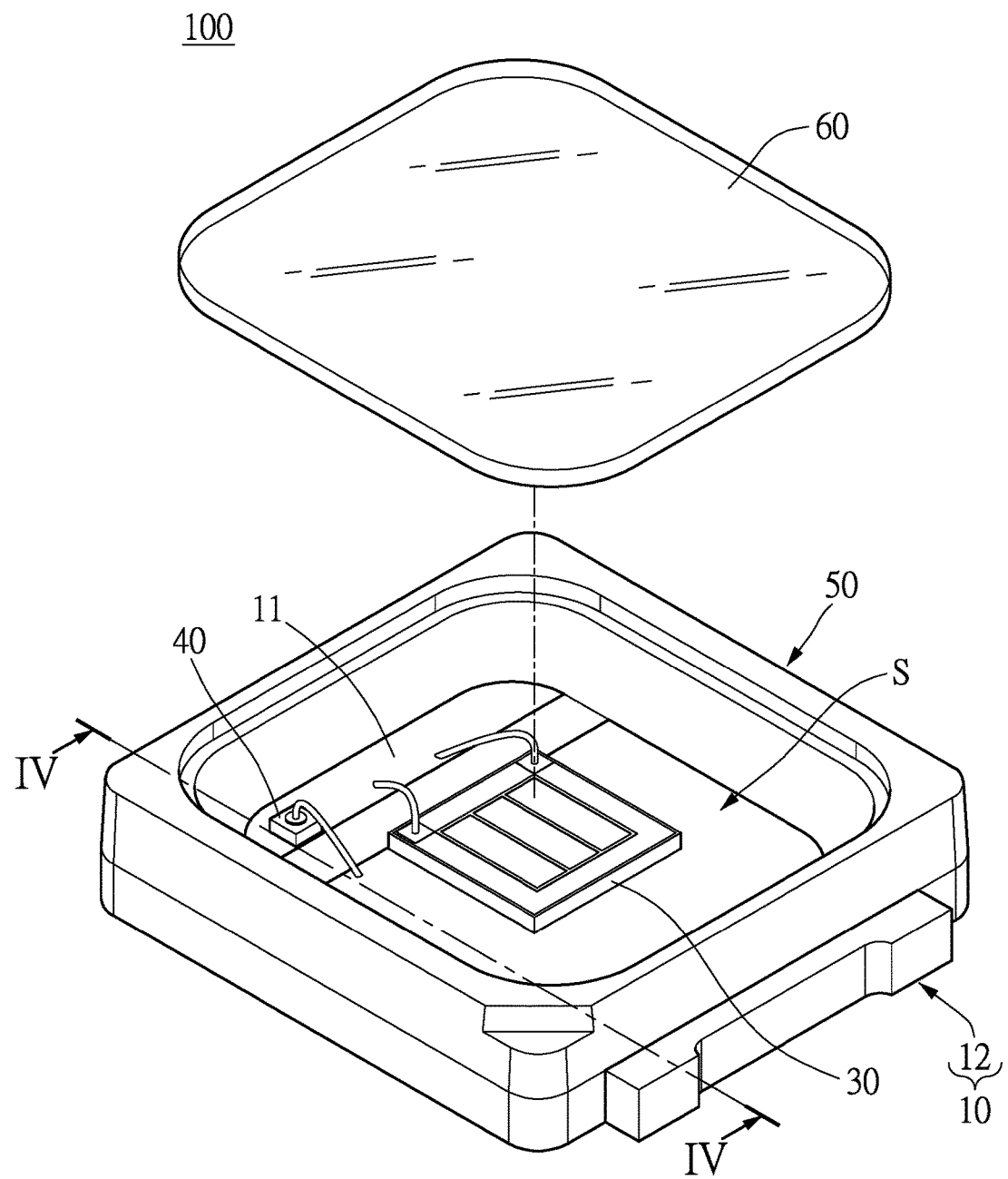
FIG. 1 is a perspective view of an LED package structure of the present disclosure.
Figure 2:
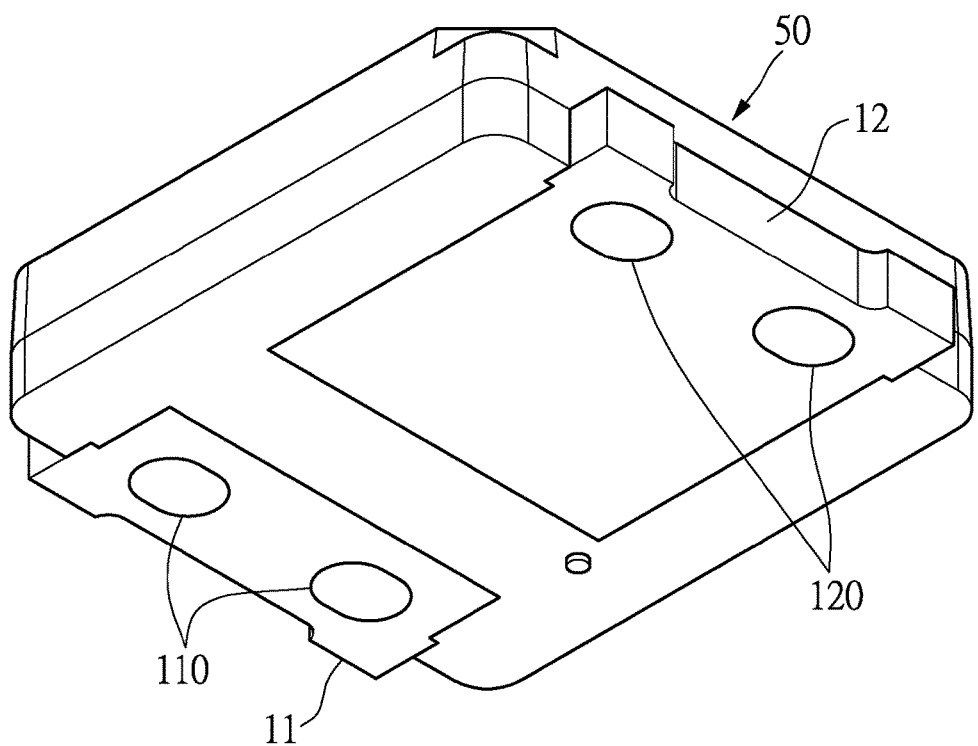
FIG. 2 is another perspective view of the LED package structure of the present disclosure.
Figure 3:
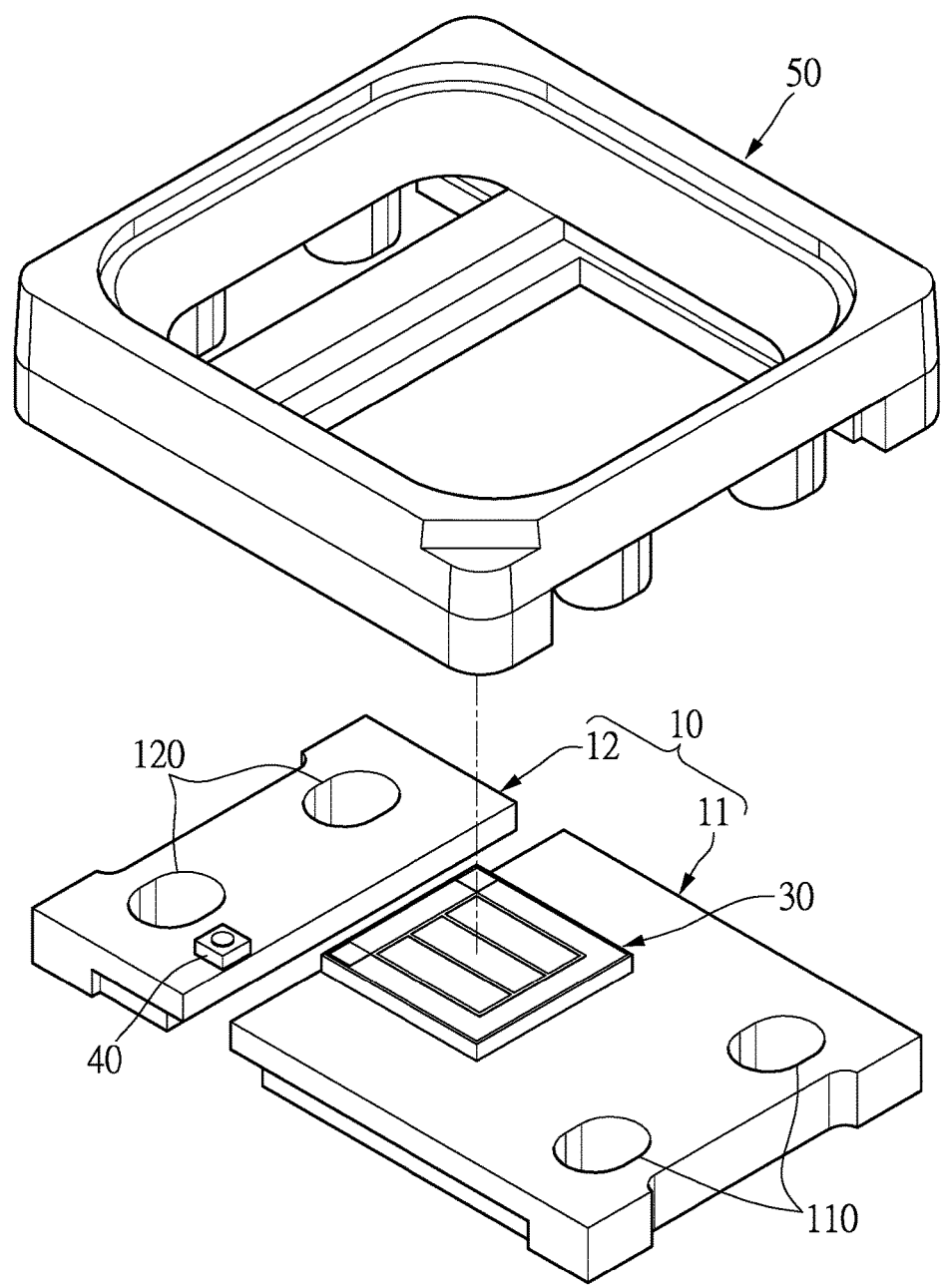
FIG. 3 is an exploded view of the LED package structure of the present disclosure.

Please refer to FIGS. 1 to 2, which show the perspective views of an LED package structure of the present disclosure, and FIG. 3, which shows an exploded view of the LED package structure of the present disclosure, an LED package structure 100 of the present disclosure includes a conductive frame assembly 10, a UV LED chip 30, and a reflective housing 50. The reflective housing 50 is combined with the conductive frame assembly 10, and part of the reflective housing 50 protrudes from a top surface of the conductive frame assembly 10 and incorporates with the conductive frame assembly 10 to form an accommodating space S. The UV LED chip 30 emitting the UV light is disposed on the conductive frame assembly 10 and located within the accommodating space S. As shown in FIG. 1 and FIG. 4, a cover 60 may be disposed at a top surface of the reflective housing 50. In other embodiments, as shown in FIG. 4A, an encapsulant 70 may be disposed within the accommodating space S of the reflective housing 50, and the encapsulant 70 is required to be UV-resistant to avoid being degradation due to a long-time UV irradiation. By dispensing the transparent encapsulant 70 inside the accommodating space S, and then the encapsulant 70 is located between the UV LED chip 30 and air, such that the photon loss at the interface can be improved. Therefore, the light extraction efficiency can be enhanced. Furthermore, the encapsulant 70 may be functioned of a protection for the UV LED chip 30, stress relieving, a light guide structure and so on.

Referring to FIG. 3, the reflective housing 50 and the conductive frame assembly 10 are separated from each other for ease of illustration. In an actual manufacturing process, the reflective housing 50 may be combined with the conductive frame assembly 10 through molding, such as injection molding or transfer molding. The conductive frame assembly 10 includes a first plate-shaped conductive frame 11 and a second plate-shaped conductive frame 12 separated from each other. The size of the first conductive frame 11 is greater than that of the second conductive frame 12. The first conductive frame 11 and the second conductive frame 12 are provided with two through-holes 110, 120 respectively, such that the reflective housing 50 can be securely disposed on the first conductive frame 11 and the second conductive frame 12. However, the LED structure 100 in the present embodiment is not limited to the construction shown in the figures. Part of the first conductive frame 11 and part of the second conductive frame 12 are exposed from a bottom surface of the reflective housing 50 so as to be the soldering portions of the LED structure, such that a SMD (Surface Mount Device) type LED structure is constructed in this present disclosure. The LED structure may be a package structure based on PLCC (Plastic Leaded Chip Carrier) type or QFN (Quad flat no leads) type. A conductive frame used in the PLCC type package structure is a metal carrier formed by a metal, such as copper, iron, aluminum, etc., or a metal alloy with a high thermal conductivity. A coating, such as silver, gold, or nickel/palladium/gold is coated on a top surface and/or the bottom surface of the metal carrier. After that a molding process is implemented in order to form a reflective housing on the conductive frame assembly.

Please refer to FIG. 1 and FIG. 4. FIG. 4 is a cross-sectional view along an IV-IV line in FIG. 1 according to the present disclosure. In the present embodiment, the UV LED chip 30 is placed on the first conductive frame 11, and a Zener diode 40 is disposed on the second conductive frame 12 to provide electrostatic discharge protection. Both the UV LED chip 30 and the Zener diode 40 are fixed to the conductive frame assembly 10 through a die-attach adhesive P.

As shown in FIG. 4, because the die-attach adhesive is a poor-UV resistant epoxy resin, a coating material C is preferably applied around the UV LED chip 30 and the Zener diode 40 to cover the die-attach adhesive P. The coating material C is preferably made of a silicone material in mixture with an inorganic material having an energy gap greater than or equal to 4 eV. Alternatively, the die-attach adhesive in the present embodiment is a material containing no epoxy resin, such as a silver paste or a silicone paste.

One of the features of the present disclosure is that a silicone molding compound (SMC) is used in the reflective housing 50 as a main material. The silicone molding compound (SMC) in the present embodiment is mainly composed of about 50-60% silicone resin, about 40% of glass fibers, inorganic fillers, and other additives. This thermosetting molded compound has a thermal curing temperature at about 150° C. The reflective housing 50 in the present embodiment includes a silicone molding compound and a filler mixed within the silicone molding compound. The filler is provided for increasing the light reflectivity of the reflective housing 50, and preferably is granular and mixed within the silicone molding compound, as shown by the granular elements in FIG. 4. The reflective housing 50 is formed as an integral, one-piece structure. The reflective housing 50 may be formed by a molding process.

The filler in the present disclosure may be applicable to an LED package structure in a UV waveband; the filler preferably is UV-resistant and inorganic. The major principle of the present embodiment is that when the photon excitation energy is less than the energy gap of the material, light absorption will not occur. The photon excitation energy of UV light is about at least 3 electron volts (eV). When the photon excitation energy is less than the energy gap of the filler, light absorption will not occur. Thus, in the present embodiment, the filler material having an energy gap greater than or equal to 4 electron volts (eV) is preferably selected. For example, the energy gap of silicon dioxide ($SiO_2$) is 9 electron volts (eV), the energy gap of boron nitride (BN) is 5.96 electron volts (eV), the energy gap of aluminum oxide ($Al_2O_3$) is 4.1 electron volts (eV), and so on, but it is not limited thereto. When the energy gap of the filler is greater than or equal to 4 electron volts (eV), light is not absorbed by the filler in the UV waveband. Thus, the absorption of UV light can be reduced, and the light reflectivity can be improved in the present embodiment. In addition, the greater an energy gap of the filler is, the shorter the emission wavelength of a suitable UV LED chip will be.

In the present embodiment, in order to improve the light reflectivity of the LED package structure 100, a better light efficiency is obtained accordingly. The refractive index difference between the refractive index (RI) of the filler and that of the silicone molding compound is also to be a key factor to improve the overall light reflectivity of the reflective housing 50.

Figure 5:
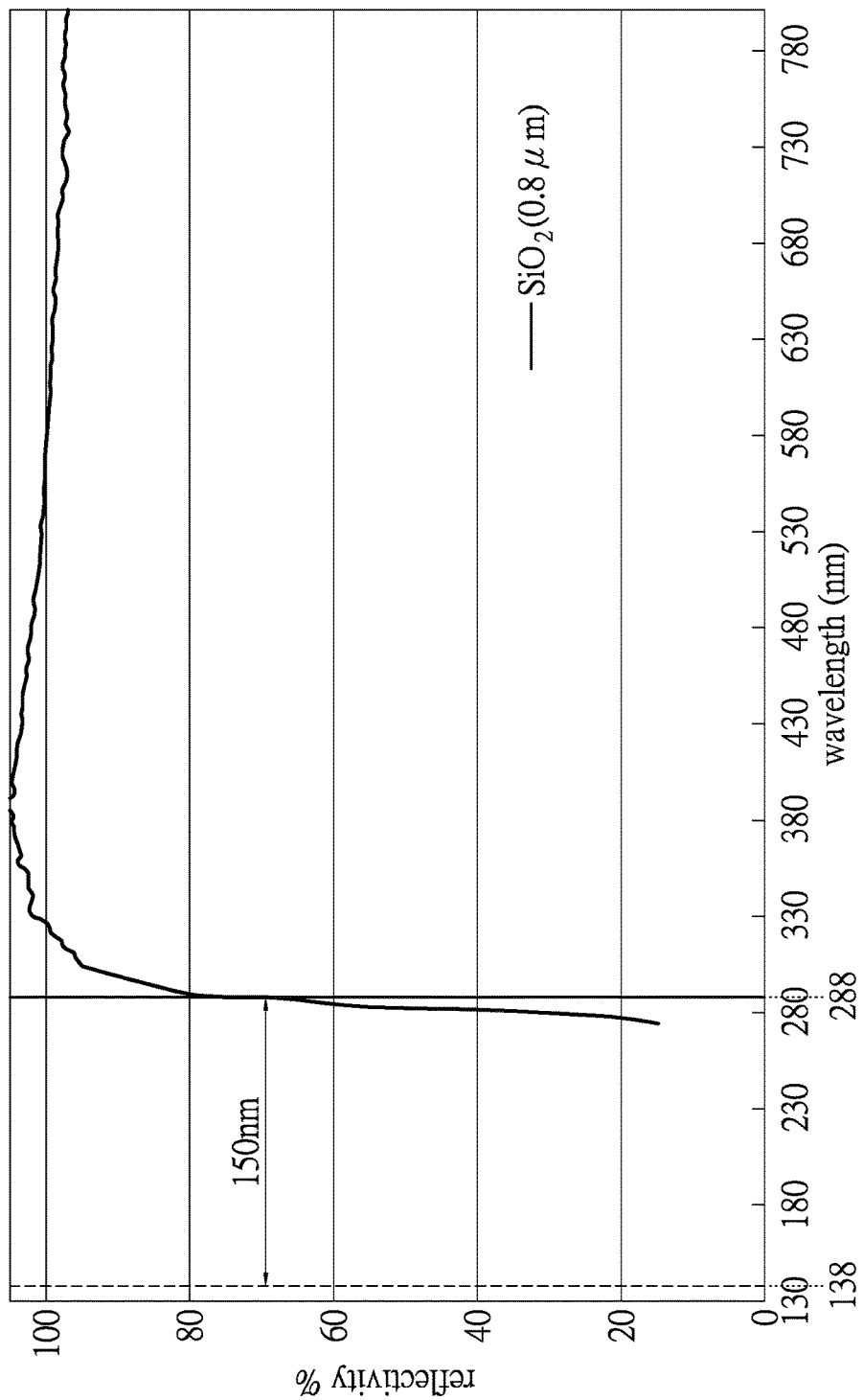
FIG. 5 is a light reflectivity diagram of a first material sample of the present disclosure.

The present disclosure has determined the light reflectivity of the several material samples at various light wavelengths by using a spectrometer. Firstly, the test is carried out for the condition when the refractive index difference between the refractive index of the filler and that of the silicone molding compound is less than or equal to 0.2. A first material sample, including the silicone molding compound with a refractive index of 1.53 and the filler made of silicon dioxide ($SiO_2$) with a refractive index of 1.43, yield a refractive index difference of 0.1. The particle size of the silicon dioxide ($SiO_2$) is 0.8 μm (micrometer), and the weight percentage of the silicon dioxide mixed within the silicone molding compound is 30.3%. Taking the first material sample for example, the light reflectivity of the first material sample at each waveband is determined through the spectrometer. The results are summarized in a diagram of FIG. 5. The horizontal axis represents the wavelength of the light, whereas the vertical axis represents the light reflectivity.

According to Planck's formula:

$$E = h \cdot c/\lambda = 1240 (nm \cdot eV)/\lambda \qquad \text{formula (1)},$$

wherein E is the energy of incident photons; h is the Planck's constant; c is the velocity of light; and λ is the wavelength.

The calculated wavelength 137.7 nanometers (nm), about 138 nm is obtained by substituting silicone dioxide ($SiO_2$) with an energy gap of 9 eV into the above formula (1). Then, compared to FIG. 5 obtained by the actual testing result, under the condition of that the light reflectivity is above 60% in the present embodiment, the corresponding wavelength is 288 nm. The subtraction between the calculated wavelength and the actual wavelength is 150 nm, and thus the wavelength shift of about 150 nm is substituted into the formula (1) in the present embodiment. The filler in the present disclosure is satisfied the following formula:

$$E \geq 1240 \ (nm \cdot eV)/(\lambda - 150 \ (nm)) \qquad \text{formula (2)}$$

Therefore, the LED package structure having a desired wavelength emitted from the LED chip can be designed according to the above formula (2) in the present disclosure. The value of the energy gap required by the filler may be obtained by substituting the wavelength of the LED chip into the above formula. Then, the light reflectivity of the LED package structure can be inferred according to the diagram of the testing result.

It is assumed that the LED package structure may be designed to emit a wavelength of 365 nm. The result of $E \geq 5.77$ eV, i.e., the value of energy gap is required for the filler by substituting 365 nm into the above formula (2). From FIG. 5, it is known that when the energy gap of the filler is selected to be $E \geq 5.77$ eV, such as the silicon dioxide ($SiO_2$) having the energy gap of 9 eV, that meets this condition. Here, the particle size of $SiO_2$ may be 0.8 μm. A light reflectivity of about 104% can be obtained at the wavelength of 365 nm for the designed LED package structure. (Note that the light reflectivity of above 100% in FIG. 5 results from some errors of the machine, and may be regarded as 100%)

The result of E≥7.75 eV may be obtained by substituting the 310 nm into the above formula (2). From FIG. 5, it is known that when the energy gap of the filler is selected to be E≥7.75 eV, such as silicon dioxide (SiO$_2$) having the energy gap of 9 eV, that meets this condition. Here, the particle size of SiO$_2$ may be 0.8 μm. A light reflectivity of about 96% can be obtained at the wavelength of 310 nm for the designed LED package structure.

The result of E≥8.86 eV may be obtained substituting the 290 nm into the above formula (2). From FIG. 5, it is known that when the energy gap of the filler is selected to be E≥8.86 eV, such as silicon dioxide (SiO$_2$) having the energy gap of 9 eV, that meets this condition. Here, the particle size may be 0.8 μm. A light reflectivity of about 80.8% can be obtained for 290 nm in the designed LED package structure.

In addition, the second material sample is also tested in the present embodiment. The second material sample is made by the silicone molding compound having a refractive index of 1.56 (which is slightly higher than that in the first material sample) and the silicon dioxide (SiO$_2$) filler having a refractive index of 1.43. A refractive index difference between the silicone molding compound and silicon dioxide is 0.13. The particle size of the silicon dioxide (SiO$_2$) is 0.8 μm. The weight percentage of the silicon dioxide in the silicone molding compound is 15.2%. The test result is shown by the plot (2) in FIG. 8.

The value of each E1 can be calculated by the above formula (2). In combination with the light reflectivity at various wavelengths λ (nm) in FIG. 8, the tested data of silicon dioxide is summarized in Table 1 below.

TABLE 1

| waveband | Wavelength λ(nm) | E1 (eV) | SiO$_2$ Δn = 0.1 (1.53-1.43) | SiO$_2$ Δn = 0.13 (1.56-1.43) |
|---|---|---|---|---|
| | | | conditions of formulas Δn ≤ 0.2 | |
| UVA (long wavelength) | 400 | 4.96 | 104.9 | 100.4 |
| | 385 | 5.28 | 105 | 99.7 |
| | 365 | 5.77 | 104 | 98.8 |
| UVB (medium wavelength) | 310 | 7.75 | 96 | 80.1 |
| | 290 | 8.86 | 80.8 | 65.4 |
| UVC (short wavelength) | 280 | 9.54 | 34.8 | 22.9 |
| | 265 | 10.78 | 15.3 | 13.2 |
| weight percentage of the filler | | | 30.3% | 15.2% |

To sum up, it can be concluded that when the refractive index difference Δn of the filler and the silicone molding compound is less than or equal to 0.2, namely, Δn≤0.2, the UV light reflectivity of at least above 65% can be obtained at a wavelength of 290 nm to 400 nm in the present embodiment when using silicon dioxide (SiO$_2$) with a particle size of 0.8 μm as the filler.

Figure 6:
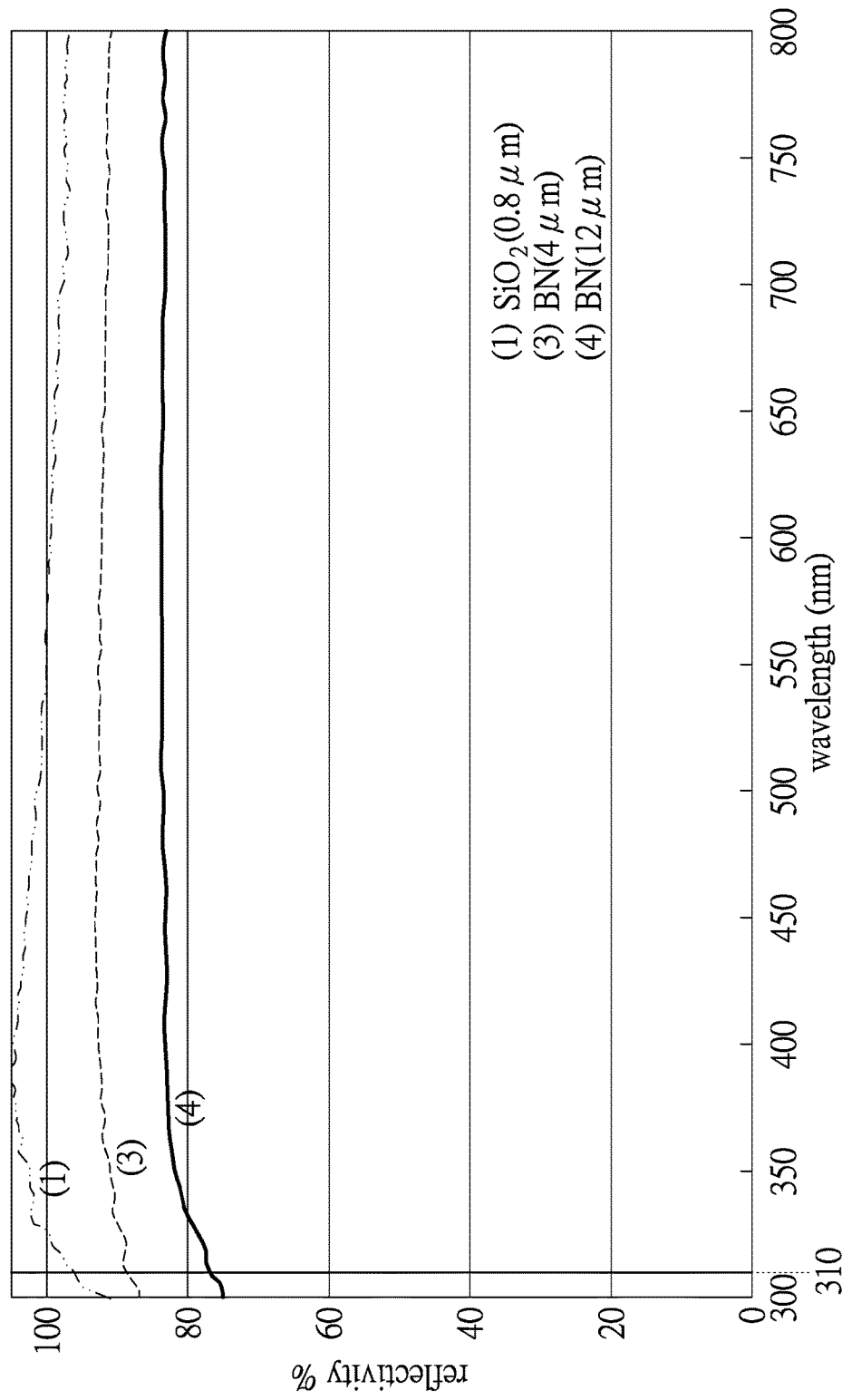
FIG. 6 is a light reflectivity diagram of a third material sample of the present disclosure.

In the present disclosure, an additional test was made for the condition when the refractive index difference between the filler and the silicone molding compound is greater than 0.2. A third material sample is formed by boron nitride (BN) having an energy gap of 5.96 eV and a refractive index of 2.17 as the filler, and the silicone molding compound having a refractive index of 1.54. A refractive index difference between boron nitride and the silicone molding compound is 0.63. In the present embodiment, boron nitride having a particle size of 4 μm and 12 μm respectively are mixed in the silicone molding compound at a weight percentage of 25%. The testing results are presented as a diagram in FIG. 6, as shown in plots (3) and (4) respectively. FIG. 6 also shows silicon dioxide (SiO$_2$) having a particle size of 0.8 μm for comparison in plot (1).

Figure 7:
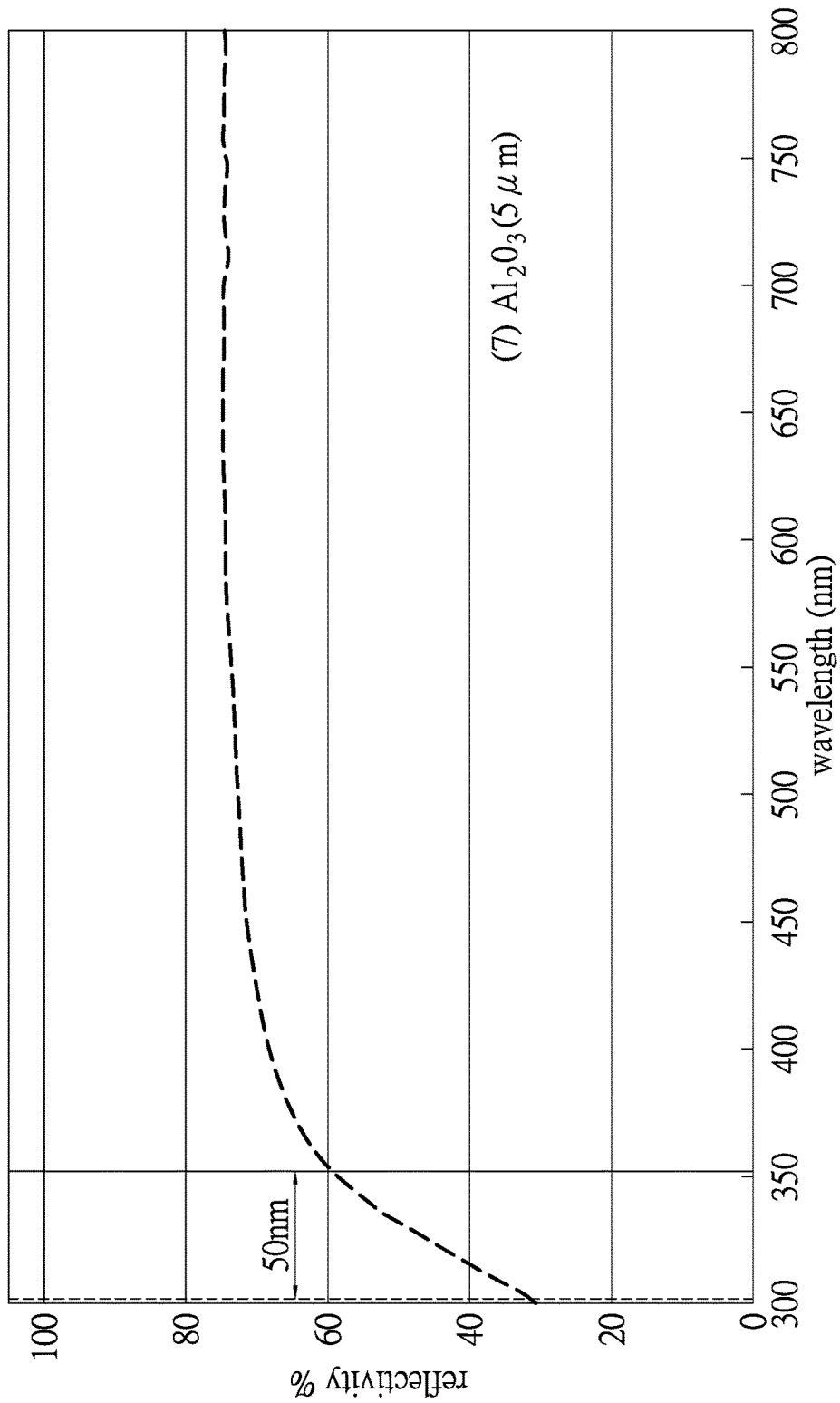
FIG. 7 is a light reflectivity diagram of a fourth material sample of the present disclosure.

A fourth material sample is prepared by the silicone molding compound having a refractive index of 1.54 and the filler such as aluminum oxide (Al$_2$O$_3$) having an energy gap of 4.1 eV and a refractive index of 1.77. A refractive index difference between aluminum oxide and the silicone molding compound is 0.23. In this embodiment, aluminum oxide having a particle size of 0.3 μm, 3 μm, 5 μm, and 25 μm, respectively are mixed in the silicone molding compound at a weight percentage of 25%. The light reflectivity at various wavelengths can be determined using the spectrometer (plots (5) to (8) in FIG. 8). The testing result of aluminum oxide having a particle size of 5 μm is summarized and presented in the diagram shown in FIG. 7.

According to the uncorrected Planck's formula, i.e. the above formula (1), the theoretically wavelength, 302 nm, can be calculated by substituting the energy gap of 4.1 eV of aluminum oxide (Al$_2$O$_3$) into the formula. Then, compared with FIG. 7 obtained by actual testing, under the condition that the light reflectivity is above 60% in the present embodiment, the corresponding wavelength is 352 nm in actual testing result. The difference between the theoretically wavelength and the actual wavelength is about 50 nm. The shift of the above wavelength difference is substituted back into formula (1). The fillers of the present disclosure is satisfied the following formula.

$$E \geq 1240 \ (nm \cdot eV)/(\lambda - 50 \ (nm)) \quad \text{formula (3)}$$

It is assumed that the LED package structure is designed to be having a wavelength of 310 nm. The result of E≥4.76 eV; i.e., the value of energy gap is required for the filler by substituting the 310 nm into the above formula (3).

From FIG. 6, the energy gap of the filler is selected to be satisfied that E≥4.76 eV. The aforementioned boron nitride (BN) having an energy gap of 5.96 eV and a particle size of 4 μm and 12 μm respectively, the light reflectivity at the wavelength of 310 nm is 88.7% and 76.8%, respectively.

All kinds of material samples and the comparison groups of TiO$_2$ are summarized in Table 2 below.

TABLE 2

| | | | Δn > 0.2 | | | | | | Comparison |
|---|---|---|---|---|---|---|---|---|---|
| | | | BN RI = 2.17 Δn = 0.63 | | Al$_2$O$_3$ RI = 1.77 Δn = 0.23 | | | | group (TiO$_2$) Δn = 0.23 |
| Conditions | wavelength λ(nm) | E2 (eV) | 4 μm | 12 μm | 0.3 μm | 3 μm | 5 μm | 25 μm | 0.1 μm |
| waveband | | | | | | | | | |
| UVA (long wavelength) | 400 | 3.54 | 92.8 | 83.4 | 83.5 | 76.7 | 68.4 | 54.4 | 53.4 |
| | 385 | 3.70 | 92.5 | 83.1 | 81.5 | 75.1 | 66.8 | 53.1 | 23.6 |
| | 365 | 3.94 | 92.2 | 82.9 | 78.1 | 71.4 | 63.2 | 50.7 | 11.6 |

TABLE 2-continued

| | | | $\Delta n > 0.2$ | | | | | Comparison |
|---|---|---|---|---|---|---|---|---|
| Conditions | wavelength | E2 | BN RI = 2.17 $\Delta n = 0.63$ | | Al$_2$O$_3$ RI = 1.77 $\Delta n = 0.23$ | | | group (TiO$_2$) $\Delta n = 0.23$ |
| waveband | λ(nm) | (eV) | 4 μm | 12 μm | 0.3 μm | 3 μm | 5 μm | 25 μm | 0.1 μm |
| UVB (medium wavelength) | 310 290 | 4.77 5.17 | 88.7 | 76.8 | 53.3 | 40.2 | 36.4 | 29.4 | 6.6 |
| UVC (short wavelength) | 280 265 | 5.39 5.77 | | | | | | | |
| weight percentage of the filler | | | 25% | | | 25% | | | 25% |

Figure 8:
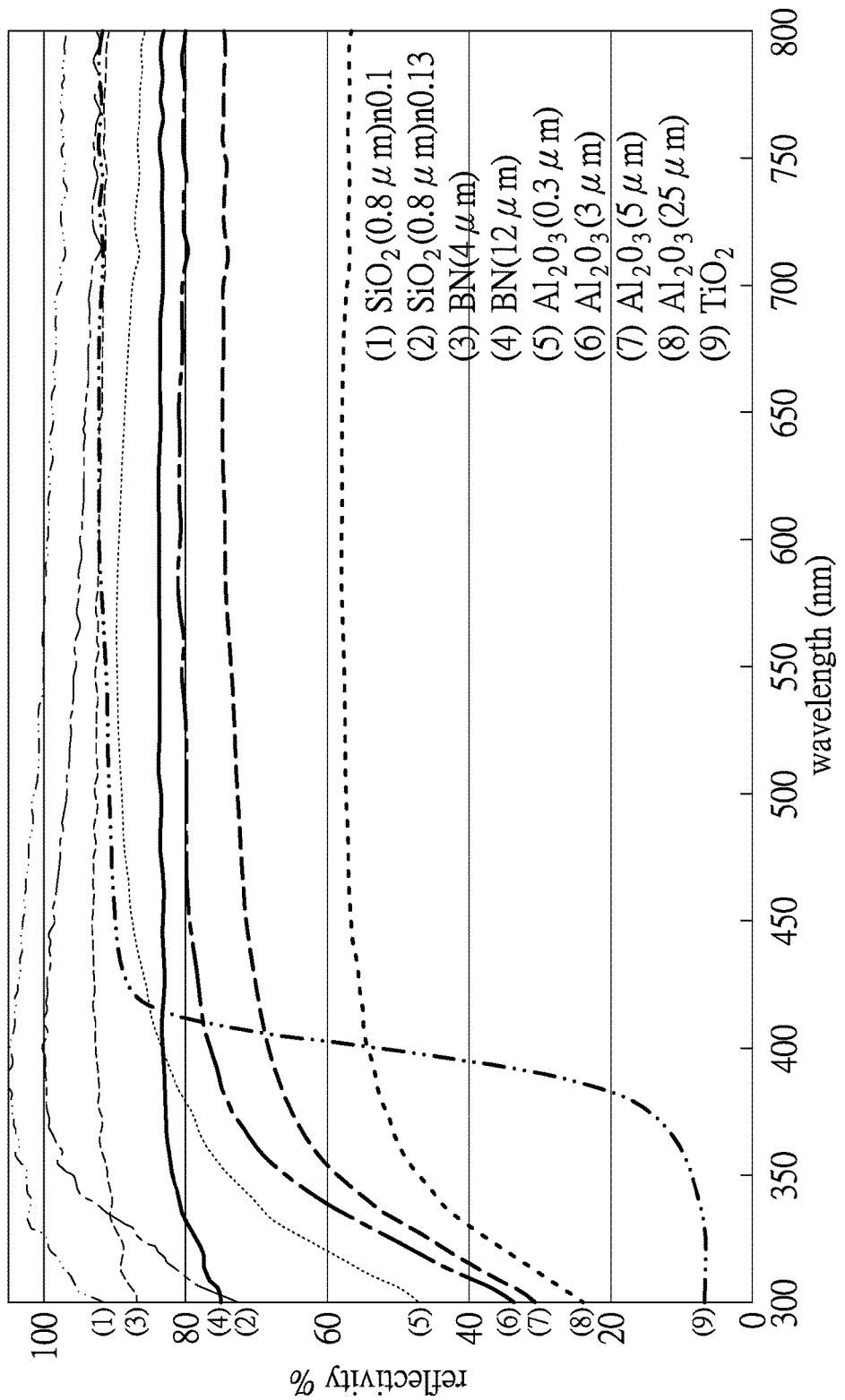
FIG. 8 is a light reflectivity diagram for all kinds of material samples of the present disclosure and silicon dioxide.

FIG. 8 is a diagram illustrating the light reflectivity of all kinds of material samples of the present disclosure. All kinds of material samples of the present disclosure are marked from plots (1) to (8). It can be clearly seen that the filler in the present disclosure, such as SiO$_2$, BN, Al$_2$O$_3$, and etc, has better light reflectivity than using the TiO$_2$ as filler in the UV waveband (see plot (9)).

To sum up, when the refractive index difference between the filler and the silicone molding compound in the present disclosure is greater than 0.2, formula (3) is satisfied. The light reflectivity of at least above 63.2% can be obtained at a UV wavelength of 365 nm to 400 nm when aluminum oxide (Al$_2$O$_3$) is chosen as the filler in the present embodiment. The light reflectivity of at least above 76.8% can be obtained at a UV wavelength of 310 nm to 400 nm when boron nitride (BN) is chosen as the filler in the present embodiment.

Additionally, the smaller the particle size of the filler is, the greater the light reflectivity can be. However, if the particle size is less than the UV wavelength, light scattering is occurred. The light reflectivity of the LED package is reduced accordingly. In addition, the particle size either too-large size or too-small size has influence for molding. It is suggested that the particle size of the filler in a range of 0.3 to 12 μm in the present disclosure is better. Moreover, the filler has a better performance at a weight percentage of above 15% based on Table 1. The larger the weight percentage of the filler is, the greater the light reflectivity is. However, the weight percentage of the filler should not greatly exceed than that of the silicone molding compound. A weight percentage of 30.3% for the filler can have a better performance. Therefore, it is suggested that the weight percentage of the filler in a range of 15%-35% in the present disclosure has better performance.

Additionally, the reflective housing 50 of the LED package structure of the present disclosure may further comprise glass fibers, and the glass fibers are preferably in a weight percentage of 5% to 40% to enhance the mechanical strength of the reflective housing.

The coating material covering the die-attach adhesive of the present disclosure is preferably a mixture of an inorganic material having a wide energy gap and a silicone resin according to the test results and formulas (2) and (3). "Wide energy gap" means that the energy gap is greater than or equal to 4 electron volts (eV). The particle size of the inorganic material is suggested to be from 0.3 to 12 μm.

Below are some features and functions of the present disclosure.

An inorganic material with a wide energy gap is chosen to be mixed with a silicone molding compound (a resin material) so as to form a reflective housing 50 of the LED package structure in the present disclosure. A lower manufacturing cost and easy production can be achieved in compared with using the ceramic material to be the reflective housing. When the ceramic material is the host material in the reflective housing, silicon or aluminum are usually contained therein in a high temperature sintering process. However, high cost and a time-consumption of the manufacturing process are existed accordingly.

An inorganic material with a wide energy gap mixed with a silicone molding compound (a resin material) is chosen for the reflective housing 50 of the LED package structure in the present disclosure. Based on the desired wavelength along with formulas (2) and (3) mentioned previously, the energy gap of the filler can be obtained, the UV waveband of 290 to 400 nm can be applied for the LED package structure.

The present disclosure is suitable for an UV LED package structure. The inorganic filler having an energy gap of greater than or equal to 4 eV is selected to be the reflective particles and is mixed with silicone molding compound to form the reflective housing 50.

The inorganic material having a wide energy gap may be coated on the die-attach adhesive, so as to prevent the die-attach adhesive from being degraded due to UV light. The suitable and cheaper inorganic materials can be selected according to the designed wavelength in the present disclosure. The inorganic material provides more options and easy production. The inorganic material having wide energy gap is only coated on the die-attach adhesive, and the whole bottom of the reflective housing is not to be coated, the material costs, easy production, and bleeding issue can be achieved.

The above description only provides preferred and applicable embodiments of the present disclosure. All equivalent changes and modifications made according to the claims of the present disclosure should fall within the protection scope of the present disclosure.

What is claimed is:

1. An LED package structure, comprising: a conductive frame assembly; a reflective housing including a silicone molding compound and a filler mixed therewith for increasing a light reflectivity of the reflective housing, the reflective housing being combined with the conductive frame assembly to form an accommodating space, the filler of the reflective housing being an inorganic material consisting of silicone dioxide; a UV LED chip being disposed on the conductive frame assembly and being located within the accommodating space of the reflective housing, the reflective housing having a light reflectivity of greater than 60% o for a UV light of the UV LED chip wherein wavelength of the UV light of the UV LED chip is in a range of 290 nm to 400 nm; and a die-attach adhesive attaching the UV LED chip on the conductive frame assembly; wherein an energy gap of the filler of the reflective housing is greater than or equal to 4 electron volts (eV); wherein a refractive index difference between a refractive index of the filler and a refractive index of the silicone molding compound of the reflective housing is less than or equal to 0.2, the energy gap of the filler satisfies the following formula: E≥1240 (nm*eV)/(λ−150(nm)), wherein 1240=h*c; h is Planck's constant; c is velocity of light; λ is a wavelength of the UV light of the UV LED chip.

2. The LED package structure of claim 1, wherein a particle size of the filler of the reflective housing is between 0.3 and 12 micrometers.

3. The LED package structure of claim 1, wherein a weight percentage of the filler of the reflective housing is in a range of 15% to 35%.

4. The LED package structure of claim 1, wherein the reflective housing comprises glass fibers having a weight percentage of 5% to 40%.

5. The LED package structure of claim 1, wherein the die-attach adhesive is a silver paste or a silicone paste.

6. The LED package structure of claim 1, wherein the die-attach adhesive is a die-attach adhesive containing epoxy resin, the LED package structure further comprises a coating material covering an external surface of the die-attach adhesive.

7. The LED package structure of claim 6, wherein the coating material is a mixture of a silicone resin and an inorganic material having an energy gap greater than or equal to 4 electron volts (eV).

8. The LED package structure of claim 1, wherein the conductive frame assembly comprises a plate-shaped first conductive frame and a plate-shaped second conductive frame separated from each other, wherein a part of the first conductive frame and a part of the second conductive frame are exposed from a bottom surface of the reflective housing.

9. The LED package structure of claim 1, wherein the LED package structure further comprises a cover placed at a top surface of the reflective housing.

10. The LED package structure of claim 1, wherein the LED package structure further comprises an encapsulant disposed within the accommodating space of the reflective housing for encapsulating the UV LED chip.

11. The LED package structure of claim 1, wherein the silicone molding compound is composed of 50-60% silicone resin, substantial 40% of additives including glass fibers or inorganic fillers, and has a thermal curing temperature at substantial 150° C.

* * * * *